(12) United States Patent
Watanabe et al.

(10) Patent No.: US 6,816,051 B2
(45) Date of Patent: Nov. 9, 2004

(54) SUPERCONDUCTING MAGNET AND MAGNETIC RESONANCE IMAGING APPARATUS USING THE SAME

(75) Inventors: Hiroyuki Watanabe, Hitachi (JP); Tsutomu Yamamoto, Hitachi (JP); Yoshihide Wadayama, Hitachiota (JP); Hirotaka Takeshima, Ryuugasaki (JP); Kenji Sakakibara, Kashiwa (JP); Takao Honmei, Hitachinaka (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/633,508
(22) Filed: Aug. 5, 2003

(65) Prior Publication Data

US 2004/0021538 A1 Feb. 5, 2004

Related U.S. Application Data (63) Continuation of application No. 10/292,003, filed on Nov. 12, 2002, now Pat. No. 6,667,676, which is a continuation-in-part of application No. 10/170,392, filed on Jun. 14, 2002, now Pat. No. 6,664,876.

(30) Foreign Application Priority Data

Sep. 12, 2001 (JP) ........................................ 2001-275895
Sep. 12, 2002 (JP) ........................................ 2002-266204

(51) Int. Cl.[7] ................................................. G01V 3/00
(52) U.S. Cl. ....................... 335/296; 335/216; 335/297; 335/300; 324/319
(58) Field of Search ......................... 335/216, 296–301; 324/318–320; 62/51.1

(56) References Cited

U.S. PATENT DOCUMENTS 5,936,498 A * 8/1999 Takeshima et al. ......... 335/216
6,323,749 B1 11/2001 Hsieh ......................... 335/299

FOREIGN PATENT DOCUMENTS

JP 10-179546 7/1998
JP 11-16719 1/1999

* cited by examiner

Primary Examiner—Ramon M. Barrera
(74) Attorney, Agent, or Firm—Mattingly, Stanger & Malur, P.C.

(57) ABSTRACT

Effect of vibration of a refrigerator on a superconducting coil is reduced to reduce disturbance in an image.

A coolant tank for supplying a coolant to coil containers is provided separately from the coil containers, and the refrigerator is placed in the coolant tank, and a coolant circulation passage connects between the coolant tank and the coil containers.

11 Claims, 9 Drawing Sheets

SUPERCONDUCTING MAGNET AND MAGNETIC RESONANCE IMAGING APPARATUS USING THE SAME

CROSS REFERENCE TO THE RELATED APPLICATION

This is a continuation application of U.S. Ser. No. 10/292,003, filed Nov. 12, 2002 now U.S. Pat. No. 6,667,676; which is a continuation-in-part application of U.S. Ser. No. 10/170,392, filed Jun. 14, 2002 now U.S. Pat. No. 6,664,876. Also, the present application is relates to Japanese Patent Application No. 2001-275895, filed on Sep. 12, 2001, and Japanese Patent Application No. 2002-266204, filed on Sep. 12, 2002, with claiming priority based on Japanese Patent Application No. 2001-275895. The disclosure of the above-identified Japanese Patent Applications are herein incorporated by reference.

BACKGROUND OF THE INVENTION

The present invention relates to a superconducting magnet and a magnetic resonance imaging apparatus using the superconducting magnet, and particularly to a super conducting magnet suitable for an open-type MRI apparatus not giving block-feeling to a person to be inspected and an MRI apparatus using the superconducting magnet.

An example of a conventional superconducting magnet used for an MRI apparatus is disclosed in Japanese Patent Application Laid-Open No. 10-179546. The conventional superconducting magnet described in the patent gazette is constructed in such that a coil container containing the superconducting magnet immerged into cooling medium of liquid helium also serves as a helium tank for storing the liquid helium, and a refrigerator for cooling the liquid helium is directly placed in the coil container (the helium container).

Further, a method, in which a flexible portion such as a bellows is placed between a refrigerator and a cryostat portion placing the refrigerator as an accommodation against vibration of the refrigerator, is disclosed in Japanese Patent Application Laid-Open No. 11-16719. Although this method can certainly insulate the vibration between the cryostat and the cold head of the refrigerator, in order to secure the vibration insulation while the cooling performance is being secured, various kinds of such devices as described the above-described patent are necessary and accordingly the cost is increased.

However, the conventional superconductor for the MRI apparatus has the following problems.

That is, since the refrigerator for cooling the liquid helium is directly placed in the coil container, the vibration of the refrigerator is directly transmitted to the coil container, and the superconducting coil contained in the inside is also vibrated by the vibration to vibrate the generated magnetic flux. Since the vibration of the generated magnetic flux gives a bad influence to the image, no clear image can be obtained.

On the other hand, conventionally, since the coolant tank and the coil container are formed integrally, the apparatus inherently becomes bulky. When the apparatus becomes bulky, a space to receive the person to be inspected (hereinafter occasionally referred to as subject) is limited to give block-feeling for the person to be inspected upon inspection.

SUMMARY OF THE INVENTION

The present invention is made in order to solve the above problems. An object of the present invention is to provide a superconducting magnet in which the vibration of the magnetic flux generated by the superconducting magnet is suppressed so as to not give bad influence to an image by reducing the vibration transmitted from the refrigerator to the coil container containing the superconducting coil, and to provide an MRI apparatus using the superconducting magnet.

Another object of the present invention to provide an MRI apparatus which can be formed in compact and provide greater space for receiving a subject so as not to give block-feeling to the subject.

In order to accomplish the above-mentioned objects, a superconducting magnet, according to the first aspect of the present invention, comprises superconducting coils; coil containers, each of said coil container containing said superconducting coil together with coolant; and a refrigerator for cooling said coolant, said coil containers being arranged separately from and opposite to each other, a magnetic field space being formed between both of said coil containers, wherein a coolant tank for supplying the coolant to said coil containers is provided separately from said coil containers, and said refrigerator is placed in said coolant tank, a coolant circulation passage connects between said coolant tank and said coil containers, cylindrical spaces are defined in said coil container, and magnetic poles formed from ferromagnetic bodies are arranged within said cylindrical spaces.

A ferromagnetic member may be arranged on a surface in a reverse side of an opposite surface of each of said coil containers. A connecting passage may connect between said coil containers each other, and lead wires connecting said superconducting coils in said coil containers to each other pass through the inside of said connecting passage. A flexible portion may be provided in an intermediate portion of said coolant circulation passage.

According to the second aspect of the present invention, a superconducting magnet comprises superconducting coils; coil containers, each of said coil container containing said superconducting coil together with coolant; and a refrigerator for cooling said coolant, said coil containers being arranged separately from and opposite to each other, a magnetic field space being formed between both of said coil containers, wherein a coolant tank for supplying the coolant to said coil containers is provided separately from said coil containers, and an amount of said coolant in said coil container is a necessary minimum amount for maintaining superconducting coil in superconducting state.

According to the third aspect of the present invention, a superconducting magnet comprises superconducting coils; coil containers, each of said coil container containing said superconducting coil together with coolant; and a refrigerator for cooling said coolant, said coil containers being arranged separately from and opposite to each other, a magnetic field space being formed between both of said coil containers, wherein cylindrical spaces are defined in said coil container, and magnetic poles formed from ferromagnetic bodies are arranged within said cylindrical spaces, and an angle of visibility in vertical direction defined by said magnetic poles as viewing an opening portion of upper and lower coil containers from a center of said superconducting magnet, is greater than or equal to 30.

A connecting passage connects between said coil containers each other, and lead wires connecting said superconducting coils in said coil containers to each other may pass through the inside of said connecting passage.

According to the fourth aspect of the present invention, a superconducting magnet comprises superconducting coils; coil containers, each of said coil container containing said superconducting coil together with coolant; and a refrigerator for cooling said coolant, said coil containers being arranged separately from and opposite to each other, a magnetic field space being formed between both of said coil containers, wherein a coolant tank for supplying the coolant to said coil containers is provided separately from said coil containers, said coil container and said coolant tank are connected to a coolant passage, a crossover from said superconducting coil is arranged within said coolant lank, and said crossover and a permanent current switch are connected within said coolant tank.

A bed capable of mounting a body to be inspected and moving between said coil containers of said superconducting magnets opposite to each other; and a control unit for analyzing a nuclear magnetic resonance signal from the body to be inspected.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiments of a superconducting magnet and a magnetic resonance imaging apparatus using the same in accordance with the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

Figure 17:
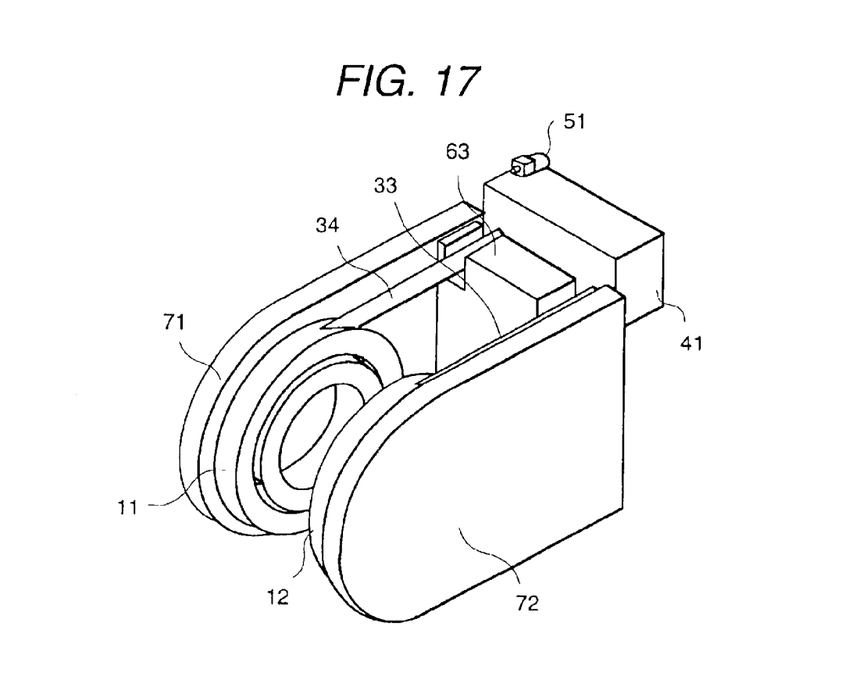
FIG. 17 is a perspective view showing another embodiment of a superconducting magnet in accordance with the present invention.
Figure 18:
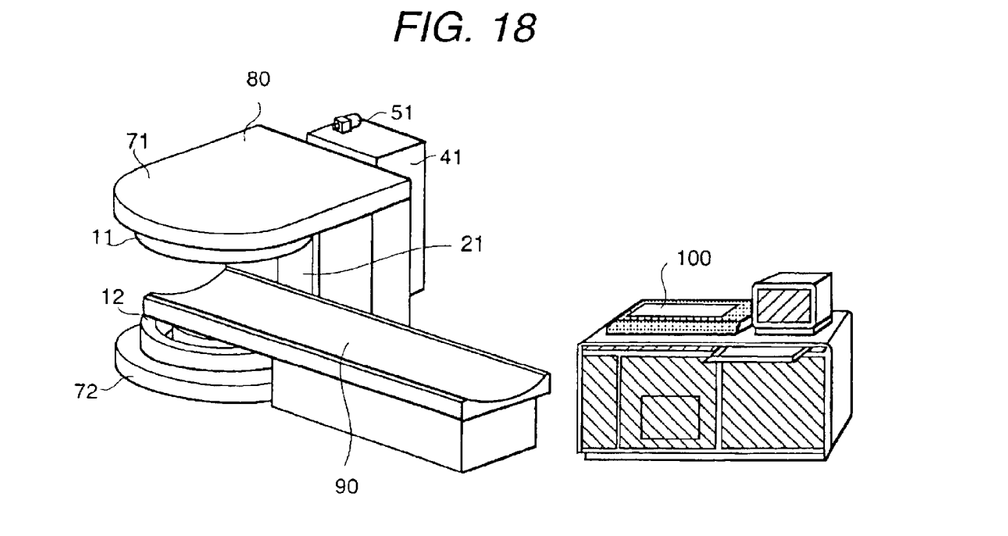
FIG. 18 is a perspective view showing a magnetic resonance imaging apparatus using the superconducting magnet in accordance with the present invention.

Initially, the construction of an MRI apparatus will be briefly described below. As shown in FIG. 17, the MRI apparatus comprises a superconducting magnet which is comprised of superconducting coils, not shown, coil containers 11 and 12 each containing the superconducting coil together with a coolant (for example, liquid helium), a coolant tank 41 for storing the coolant and a refrigerator for cooling the coolant; a bed 90 for mounting a body to be inspected; and a control unit 100 for analyzing a nuclear resonance signal from the body to be analyzed. The coil containers 11 and 12 are arranged separately from and opposite to each other, and a magnetic field space is formed between both of the coil containers 11 and 12, and a tomogram is taken by passing the body to be inspected mounted on the bed 90.

Embodiments of the superconducting magnet employed in the above-described MRI apparatus will be described below.

Figure 1:
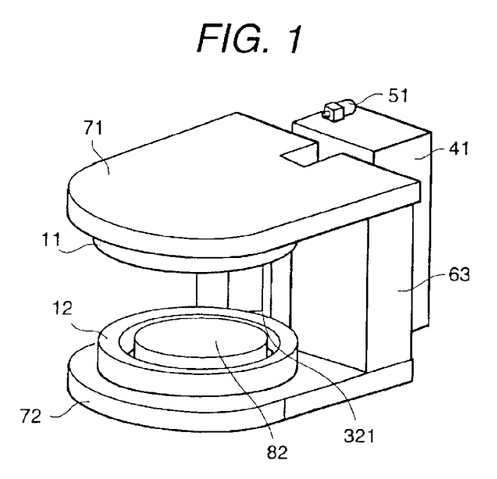
FIG. 1 is a perspective view showing an embodiment of a superconducting magnet in accordance with the present invention.
Figure 2:
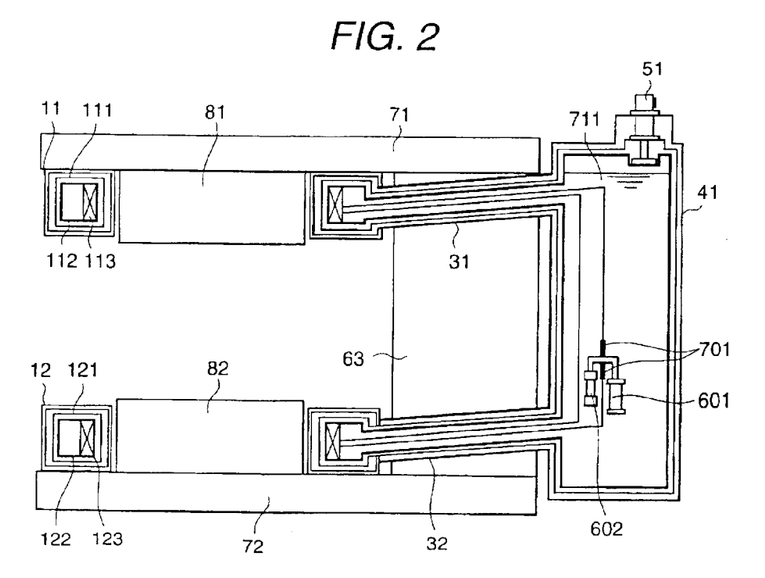
FIG. 2 is a perspective view showing another embodiment of a superconducting magnet in accordance with the present invention.
Figure 3:
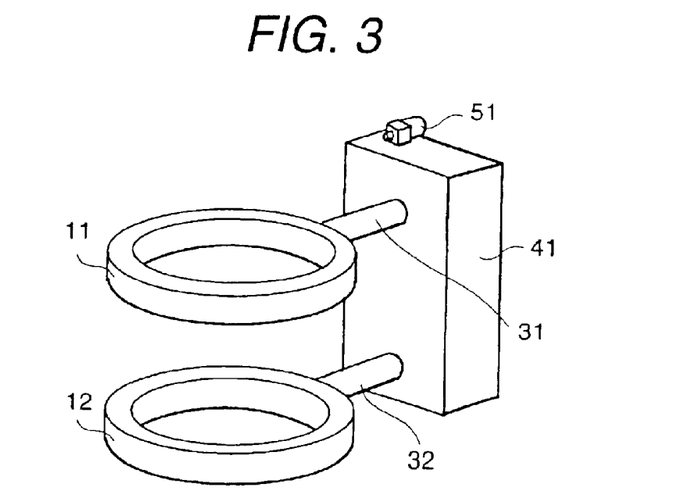
FIG. 3 is a perspective view showing another embodiment of a superconducting magnet in accordance with the present invention.

FIGS. 1, 2 and 3 show the first embodiment of a superconducting magnet. FIG. 3 is illustrated with removing magnetic pole supporting members 71 and 72, magnetic poles 81 and 82 and a support member 63. In this embodiment, the coolant tank (hereinafter, referred to as He tank) 41 for supplying the coolant to the coil containers 11 and 12 is provided separately from the coil containers 11 and 12, the refrigerator 51 is arranged in the He tank 41, and a coolant circulation passage 31 (pipe) connects between the He tank 41 and the coil containers 11 and 12. The coil containers 11 and 12 are supported by the He tank 41 through a support member 61.

In the coil containers 11 and 12, cylindrical spaces are defined. The magnetic poles 81 and 82 formed from ferromagnetic body are disposed within the cylindrical spaces. An upper coil portion including the magnetic pole 81 and a lower coil portion including the magnetic pole 82 are supported by the support member 63.

Namely, the upper and lower containers 11 and 12 containing the magnetic poles 81 and 82 are supported by the magnetic pole supporting members 71 and 72. The upper and lower containers 11 and 12 are supported by the support member 63 via the magnetic pole supporting members 71 and 72.

The coil containers 11 and 12 and the He tank 41 are connected with each other through the coolant circulation passages 31 and 32, respectively. By this, liquid state He is supplied to the coil containers 11 and 12 from the He tank 41. As set forth above, the refrigerator 51 is installed in the He tank 41. The refrigerator 51 is adapted to condense He gas collected to the He tank 41.

Next, as shown in FIG. 2, the coil container 11 is formed by enclosing the superconducting coil in a He container 112 together with coolant. Furthermore, a shield plate 111 is provided for evacuated insulation and for cooling by the refrigerator 51. The superconducting crossover 711 is disposed within the He tank 41. Here, a superconducting switch 602 and a protecting resistor 601 are connected.

According to the construction described above, the vibration of the refrigerator 51 hardly propagates the coil containers 11 and 12 because the coil containers 11 and 12 are placed at a position distant from the He tank through the passage 31. Therefore, the effect of the vibration on the magnetic uniformity in the magnetic field space formed by the superconducting coils can be reduced. On the other hand, since the magnetic poles 81 and 82 are provided, a uniform magnetic field is formed at the center portion where magnetic field tends to be non-uniform, without increasing magnets, to permit production of MRI at low cost.

On the other hand, by providing a permanent current switch 602 within the He tank 41 and providing a superconducting connection 701 of the permanent current switch by placing the He tank 41 away from magnetic field space, empirical magnetic field can be reduced. This makes it possible to set lower load ratio (greater margin) to achieve lowering of cost and improve reliability. On the other hand, by placing the permanent current switch and the superconducting connecting portion within the He tank, size of the coil container can be limited to necessary minimum size. Namely, amount of liquid state helium can be necessary minimum amount for maintaining the coil in superconducting state. Thus, amount of liquid state helium in the coil container can be reduced to contribute to down-sizing of the coil container. By this, a space to receive the person to be inspected or subject can be made wider to eliminate block-feeling given to the subject. Furthermore, medical access to the subject during inspection, such as performing surgical process with monitoring the display image, is facilitated.

Figure 4:
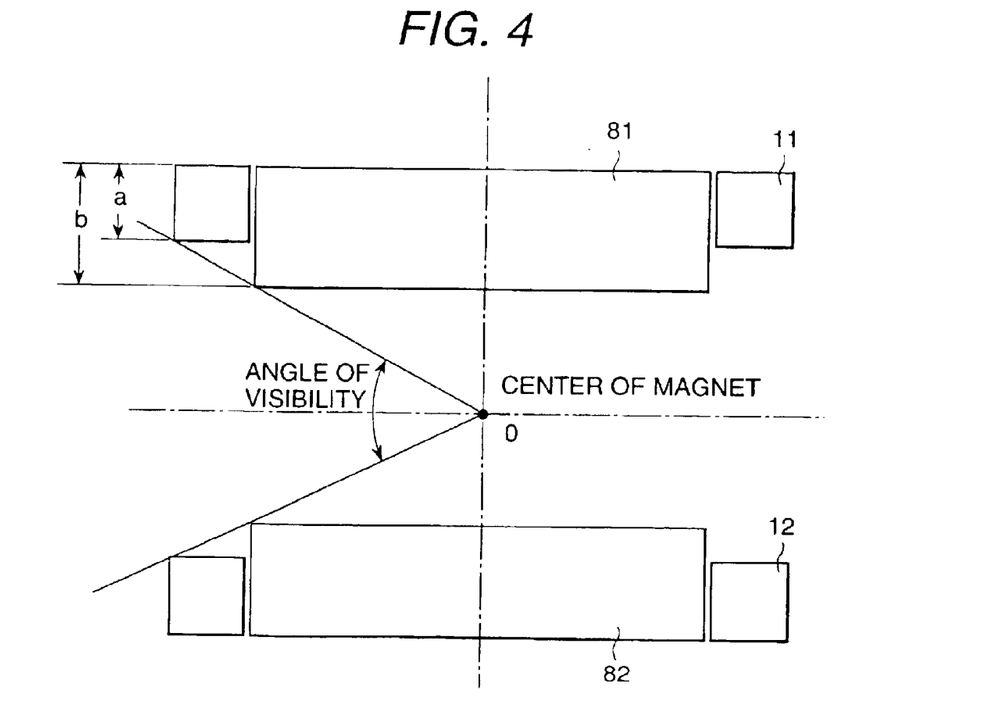
FIG. 4 is a perspective view showing another embodiment of a superconducting magnet in accordance with the present invention.

FIG. 4 is a diagrammatic illustration showing portion around the coil of FIG. 1. With reference to FIG. 4, angle of visibility is defined. Namely, as viewing opening portion of the upper coil 11 and the lower coil 12 from the center O of the magnets 81 and 82, an angle in vertical direction defined by the magnetic poles is referred to as angle of visibility. In the shown embodiment, by forming the coil container compact as set forth in the first embodiment, and by making a height (dimension a in the drawing) lower than a height of the magnetic pole portion (dimension b in the drawing), the angle of visibility can be made larger, e.g. greater than or equal to 30.

Figure 5:
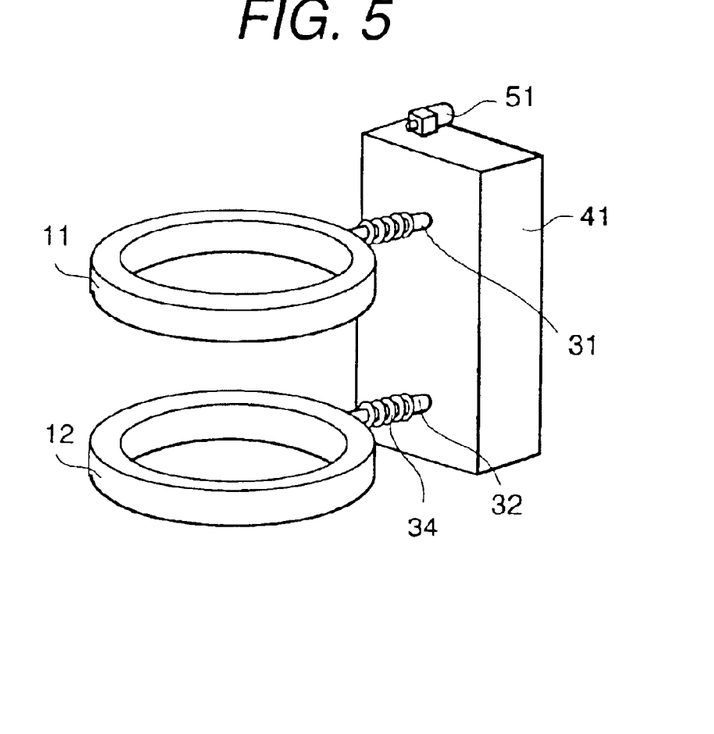
FIG. 5 is a perspective view showing another embodiment of a superconducting magnet in accordance with the present invention.

In the second embodiment shown in FIG. 5, the construction of the present embodiment is that a vibration isolating means 33 and 34 are provided in intermediate portions of the passages 31 and 32 for connecting the coil containers 11 and 12 to the He tank 41 described in the above-described embodiments, respectively. The superconducting magnet of the present invention is essentially constructed so as to hardly receive the vibration of the refrigerator because the passage is provided between the coil containers 11, 12 and the coolant tank 41 in which the refrigerator is placed. However, by providing the vibration isolating means described above in the passages 31 and 32, the isolation of vibration can be further secured.

By the vibration isolating means, it is possible to effectively suppress the vibration of the refrigerator to transmit to the coil containers.

Figure 6:
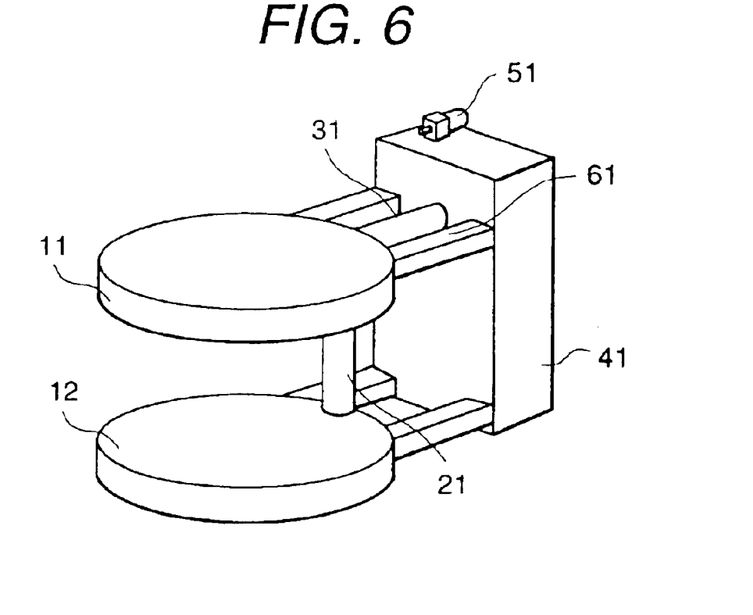
FIG. 6 is a perspective view showing another embodiment of a superconducting magnet in accordance with the present invention.

FIG. 6 shows a third embodiment of a superconducting magnet.

In this embodiment, the coolant tank (hereinafter, referred to as He tank) 41 for supplying the coolant to the coil containers 11 and 12 is provided separately from the coil containers 11 and 12, the refrigerator 51 is arranged in the He tank 41, and a coolant circulation passage 31 (pipe) connects between the He tank 41 and the coil containers 11 and 12. The coil containers 11 and 12 are supported by the He tank 41 through a support member 61.

Further, a connecting passage 21 connects between the upper and the lower coil containers 11 and 12, and liquid He and He gas pass through the inside of the connecting passage 21, and coil connecting wires also pass through. Furthermore, a passage 31 connects between the coil container 11 and the He tank 41 so that the liquid He can supplied from the He tank 41 to the coil container 11 through the passage 31 and the He gas can be returned to the He tank 41. The refrigerator 51 is installed in the He tank 41 as described above, and the role of the refrigerator 51 is to condense the He gas returned to the He tank 41.

According to the construction described above, the vibration of the refrigerator 51 hardly propagates the coil containers 11 and 12 because the coil containers 11 and 12 are placed at a position distant from the He tank through the passage 31. Therefore, the effect of the vibration on the magnetic uniformity in the magnetic field space formed by the superconducting coils can be reduced.

Figure 7:
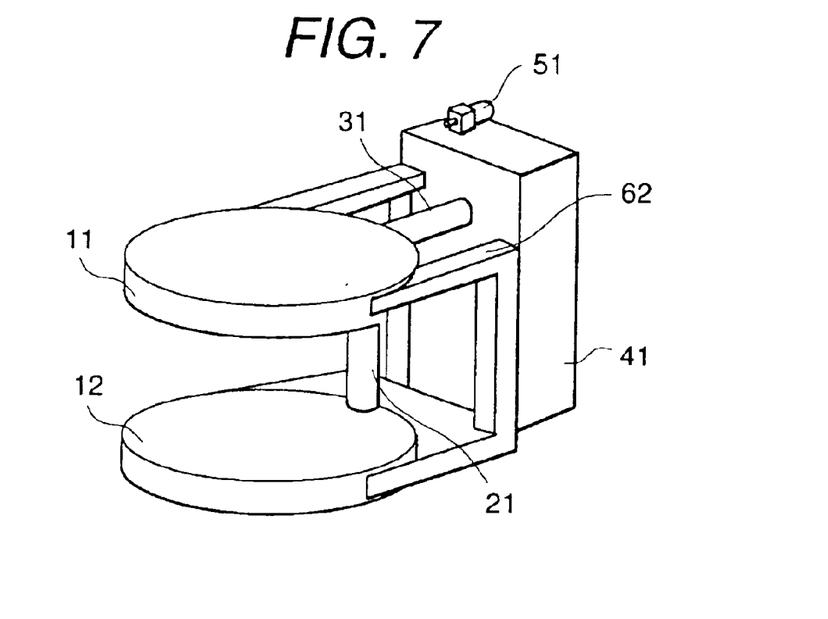
FIG. 7 is a perspective view showing another embodiment of a superconducting magnet in accordance with the present invention.

FIG. 7 shows a fourth embodiment of a superconducting magnet.

The construction of the present embodiment is that in the third embodiment, the coil container support member 62 for supporting the upper and the lower coil containers 11 and 12 is provided separately from the He tank 41. Although the construction has the same effect as that of the first embodiment, the structure having the coil container support member 62 is more reasonable than that of the embodiment 1 when the He tank 41 can be made compact.

Figure 8:
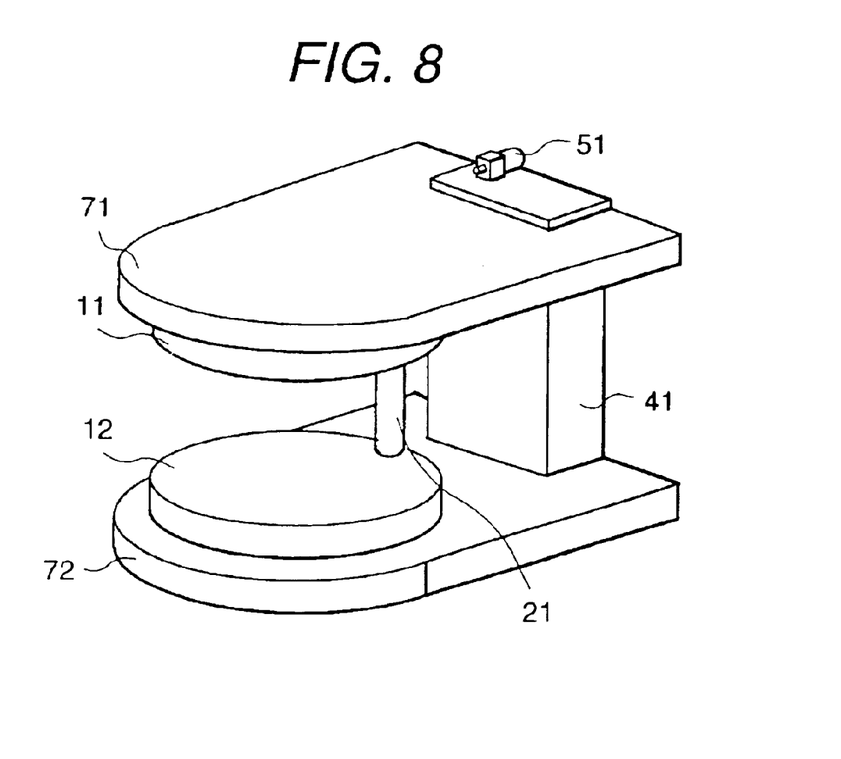
FIG. 8 is a perspective view showing another embodiment of a superconducting magnet in accordance with the present invention.

FIG. 8 shows a fifth embodiment of a superconducting magnet.

The construction of the present embodiment is that in addition to the construction of the third embodiment, the ferromagnetic members 71 and 72 are arranged in the outside (in the reverse side of the opposite surfaces) of the coil containers 11 and 12. Although the construction has the same effect as that of the first embodiment, the leakage magnetic field can be reduced by placing the ferromagnetic members 71 and 72 in those positions. In some cases, it is possible to improve the magnetic field shielding performance by arranging active shielding coils on the ferromagnetic members 71 and 72. The coil container 11 is connected to the He tank 41 through a passage, not shown in the figure.

Figure 9:
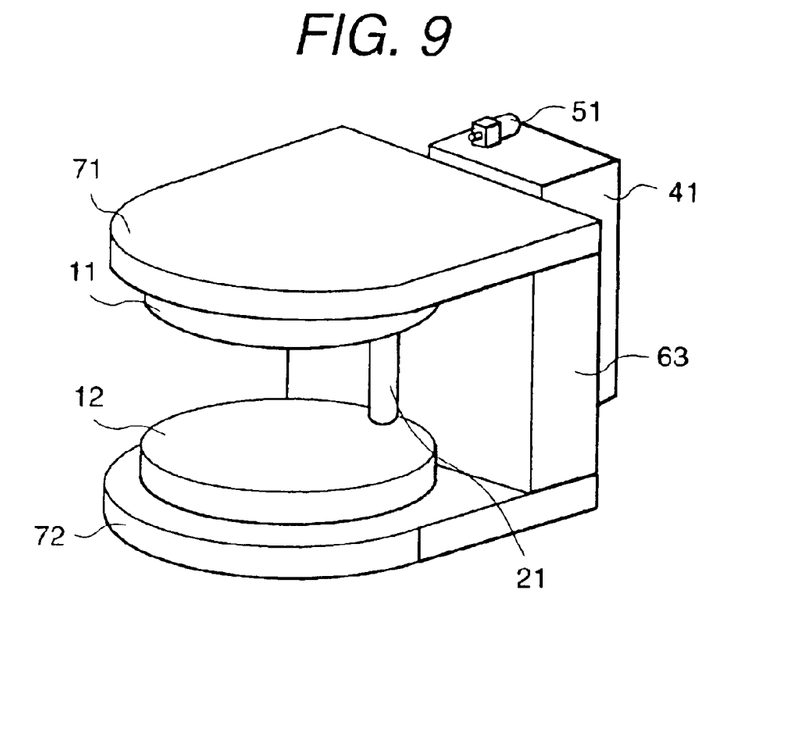
FIG. 9 is a perspective view showing another embodiment of a superconducting magnet in accordance with the present invention.
Figure 10:
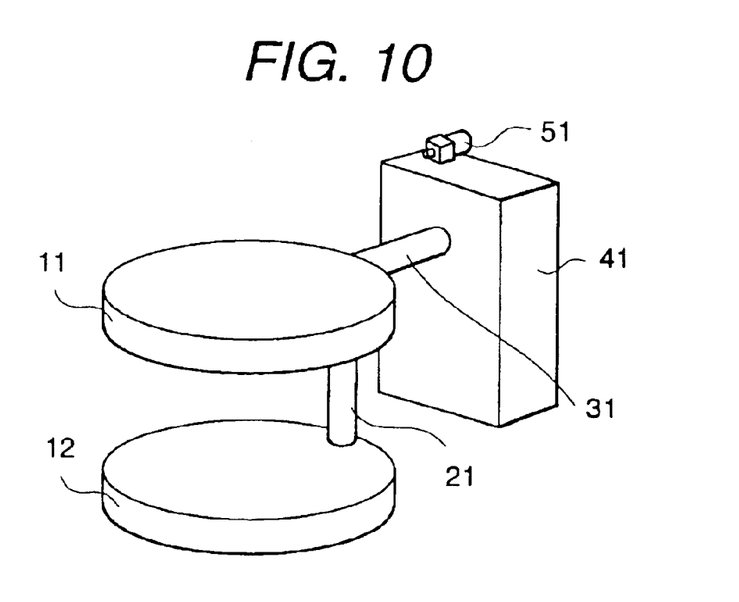
FIG. 10 is a perspective view showing another embodiment of a superconducting magnet in accordance with the present invention.

FIG. 9 and FIG. 10 show a sixth embodiment of superconducting magnet. FIG. 10 shows the state that the magnetic pole support members 71 and 72, the magnetic poles and the support member 63 illustrated in the structure of FIG. 9 are removed.

The construction of the present embodiment is that the coil containers 11 and 12 having the ferromagnetic members 71 and 72 in the outside are supported by another member 63 separated from the He tank 41.

As described in the fourth embodiment, the structure having another support 63 separately from the He tank 41 is more economical when the He tank 41 can be made compact. Further, when the support 63 is made of a ferromagnetic material (iron), a magnetic circuit is formed together with the upper and the lower ferromagnetic members 71 and 72, and accordingly the leakage magnetic field can be more effectively suppressed.

Figure 11:
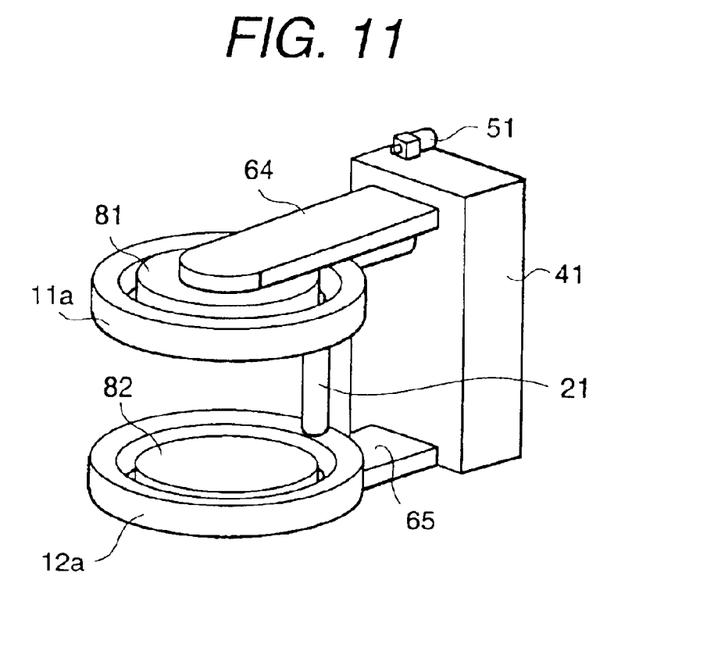
FIG. 11 is a perspective view showing another embodiment of a superconducting magnet in accordance with the present invention.

FIG. 11 shows a seventh embodiment of a superconducting magnet.

The construction of the present embodiment is that annular spatial portions are formed in the coil containers 11a and 12a and then magnetic poles 81 and 82 made of a ferromagnetic material are placed into the annular spatial portions, respectively, and the He tank 41 is also used for supporting the upper coil portion and the lower coil portion including the magnetic poles 81 and 82. That is, the coil containers 11a and 12a having the magnetic poles 81 and 82 are supported by the He tank 41 through the support members 64 and 65. The support members 64 and 65 are made of a non-magnetic material.

Of course, the same effect as the effect of the embodiment 1 can be also obtained by the construction of the present embodiment. Since the magnetic poles 81 and 82 are provided, the superconducting magnet having the magnetic poles 81 and 82 may be more economically constructed depending on the magnetic field intensity or the magnetic field uniformity.

Figure 12:
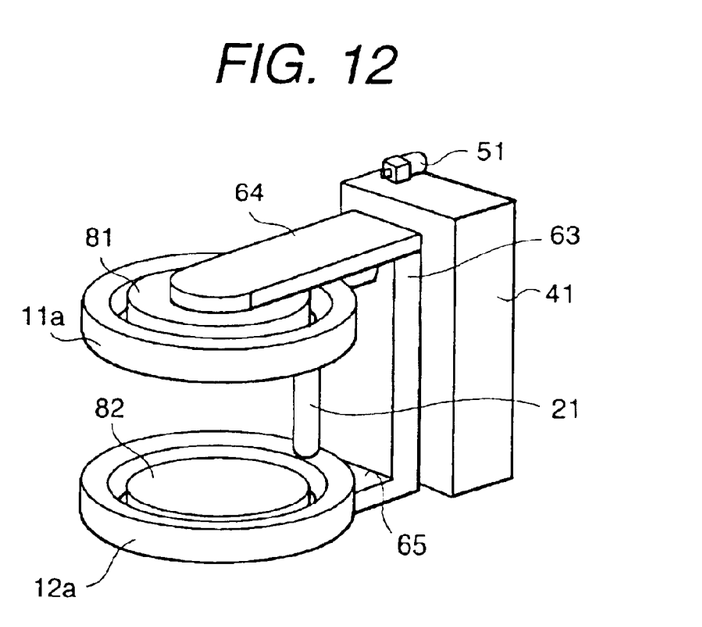
FIG. 12 is a perspective view showing another embodiment of a superconducting magnet in accordance with the present invention.

FIG. 12 shows an eighth embodiment of a superconducting magnet.

The construction of the present embodiment is that another support member 63 is provided separately from the He tank 41, and the coil containers 11a and 12a are supported by the support member 63 integrated with the support members 64 and 65 in a single unit not by the He tank 41. The construction of the present embodiment can also obtain the same effect as the effect of the embodiment 1, and is more economical when the He tank 41 can be made compact.

Figure 13:
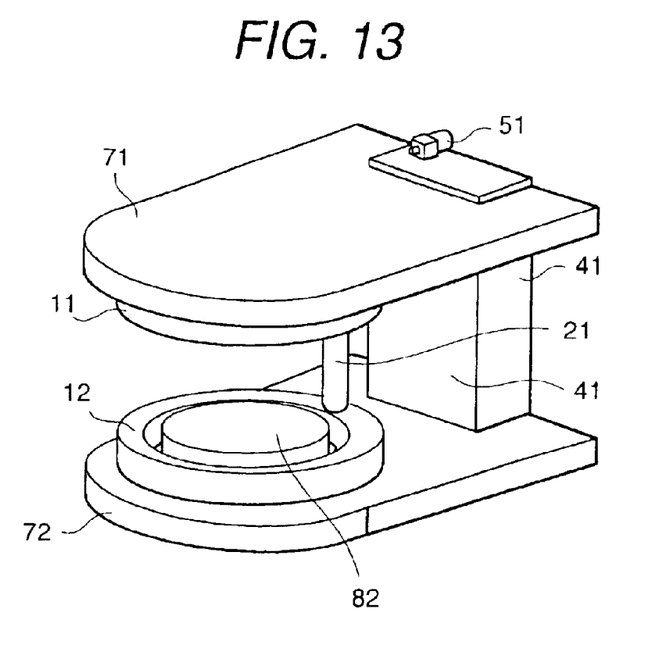
FIG. 13 is a perspective view showing another embodiment of a superconducting magnet in accordance with the present invention.

FIG. 13 shows a ninth embodiment of a superconducting magnet.

The construction of the present embodiment is that the upper and the lower coil containers 11 and 12 having the individual magnetic poles are covered with the magnetic pole support members 71 and 72 though which the upper and the lower coil containers 11 and 12 are supported by the He tank 41, respectively. The construction of the present embodiment, of course, can obtain the same effect as that of the above-mentioned embodiments, and is effective to reduce the leakage magnetic field. In order to further reduce the leakage magnetic field, it is effective to place magnetic shielding coils in the outer sides of the ferromagnetic members.

Figure 14:
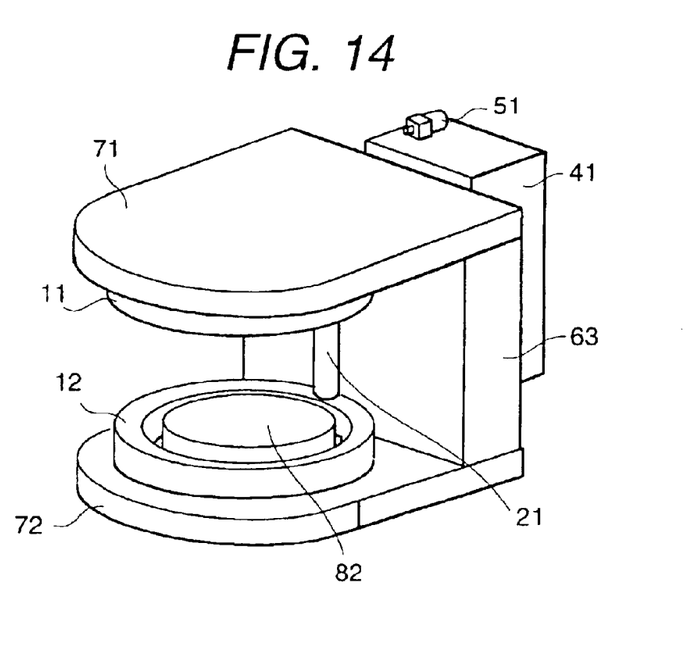
FIG. 14 is a perspective view showing another embodiment of a superconducting magnet in accordance with the present invention.
Figure 15:
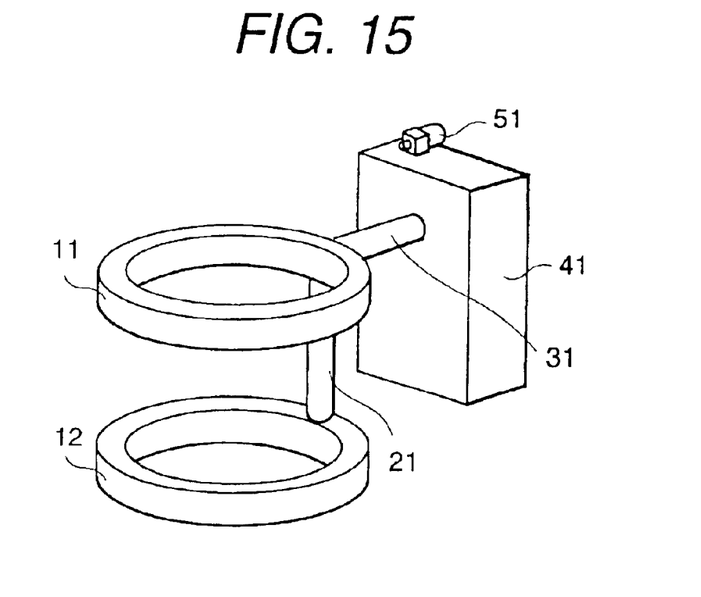
FIG. 15 is a perspective view showing another embodiment of a superconducting magnet in accordance with the present invention.

FIG. 14 and FIG. 15 show a tenth embodiment of superconducting magnet. FIG. 15 shows the state that the magnetic pole support members 71 and 72, the magnetic poles and the support member 63 illustrated in the structure of FIG. 14 are removed.

The construction of the present embodiment is that another support member 63 is provided separately from the He tank 41, and the coil containers 11 and 12 are supported by the support member 63 integrated with the magnetic pole support members 71 and 72 provided so as to cover the coil containers 11 and 12 in a single unit, and further that the magnetic pole support members 71 and 72 are made of a ferromagnetic material, and the support member 63 connecting between the upper and the lower coil containers 11 and 12 are also made of a ferromagnetic material.

The construction of the present embodiment, of course, can obtain the same effect as that of the above-mentioned embodiments, and the magnetic fluxes can be more restrained by combining the magnetic circuit to the magnetic poles 81 and 82 to further reduce the leakage magnetic field.

Figure 16:
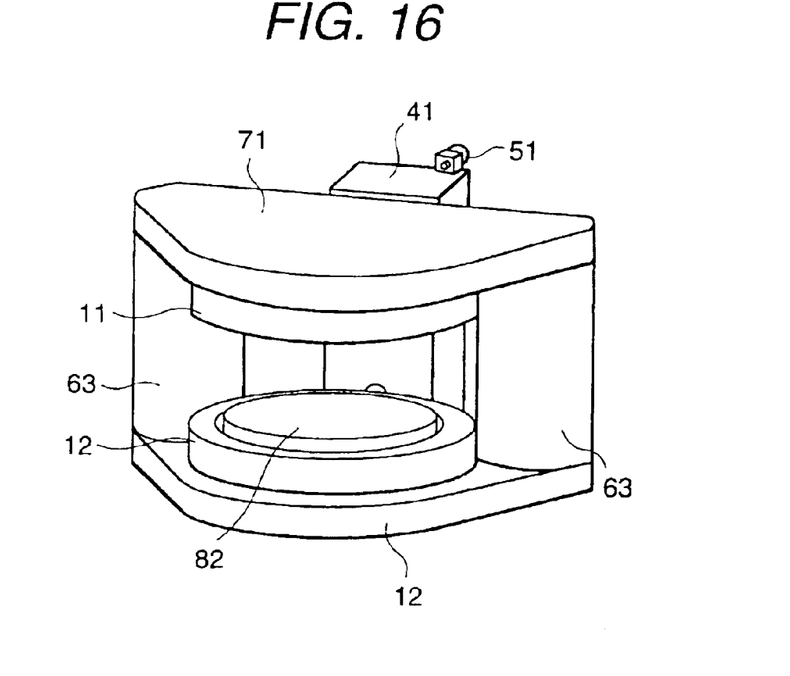
FIG. 16 is a perspective view showing another embodiment of a superconducting magnet in accordance with the present invention.

The construction of the embodiment shown in FIG. 16 is that the magnets are horizontally arranged so that the coil containers 11 and 12 are horizontally opposite to each other. In the present embodiment, it is possible to construct an apparatus in which the body to be inspected can be inspected while keeping standing.

As having described above, according to the present invention, since influence of vibration of the refrigerator for the superconducting coil can be restricted, disturbance of the display image can be successfully prevented. On the other hand, even when the apparatus is down-sized, the greater space for receiving the subject can be certainly provided to permit employment in the MRI apparatus without giving block-feeding to the subject.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A superconducting magnet comprising:

superconducting coils;

coil containers, each of said coil containers containing a superconducting coil together with coolant; and said coil containers being arranged separately from and opposite to each other, and a magnetic field space being formed between opposite sets of coil containers, wherein a support member is provided for forming a magnetic circuit so as to arrange said coil containers separately from and opposite to each other; and a connecting passageway provided in said support member for circulation of said coolant.

2. A superconducting magnet according to claim 1, wherein the coolant in one coil container communicates with other coil containers through said connecting passageway.

3. A superconducting magnet according to claim 1, wherein lead wires connecting said superconducting coils in said coil containers to each other pass through an inside of said connecting passageway.

4. A superconducting magnet according to claim 1, wherein a ferromagnetic member is arranged on a rear side of an opposite surface of each of said coil containers.

5. A superconducting magnet according to claim 1, wherein a coolant tank supplying coolant to said coil container is provided separately from said coil container, and a refrigerator is provided in said coolant tank, and said coolant tank and said coil container are in communication through a coolant circulation passage.

6. A superconducting magnet according to claim 5, wherein a flexible portion is provided in an intermediate portion of said coolant circulation passage.

7. A superconducting magnet comprising:

superconducting coils;

coil containers, each of said coil containers containing a superconducting coil together with coolant; and said coil containers being arranged separately from and opposite to each other, and a magnetic field space being formed between opposite sets of coil containers, wherein a support member is provided for forming a magnetic circuit so as to arrange said coil containers separately from and opposite to each other; and a connecting passageway provided in said support member through which lead wires connect said superconducting coils in said coil containers to each other.

8. A superconducting magnet according to claim 7, wherein the coolant in one coil container communicates with other coil containers through said connecting passageway provided in an opening portion of said support member.

9. A superconducting magnet according to claim 8, wherein lead wires connecting said superconducting coils in said coil containers to each other pass through an inside of said connecting passageway.

10. A superconducting magnet according to claim 1, further comprising a refrigerator for cooling said coolant.

11. A superconducting magnet according to claim 7, further comprising a refrigerator for cooling said coolant.

* * * * *